(12) United States Patent
Takemasa et al.

(10) Patent No.: US 11,024,598 B2
(45) Date of Patent: Jun. 1, 2021

(54) METALLIC SINTERED BONDING BODY AND DIE BONDING METHOD

(71) Applicant: SENJU METAL INDUSTRY CO., LTD., Tokyo (JP)

(72) Inventors: Tetsu Takemasa, Tokyo (JP); Minoru Ueshima, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 16/327,124

(22) PCT Filed: Aug. 17, 2017

(86) PCT No.: PCT/JP2017/029532
§ 371 (c)(1),
(2) Date: Feb. 21, 2019

(87) PCT Pub. No.: WO2018/037992
PCT Pub. Date: Mar. 1, 2018

(65) Prior Publication Data
US 2019/0393188 A1  Dec. 26, 2019

(30) Foreign Application Priority Data

Aug. 22, 2016  (JP) .............................. JP2016-162247

(51) Int. Cl.
*H01L 23/00* (2006.01)
*B22F 7/06* (2006.01)

(52) U.S. Cl.
CPC .............. *H01L 24/83* (2013.01); *B22F 7/064* (2013.01); *H01L 24/29* (2013.01);
(Continued)

(58) Field of Classification Search
CPC ..................... H01L 24/83; H01L 24/29; H01L 2224/29218; H01L 2224/29224;
(Continued)

(56) References Cited

U.S. PATENT DOCUMENTS 6,875,635 B2 *  4/2005  Cheng ............... H01L 23/49513
257/E23.04
2012/0003465 A1  1/2012  Rittner et al.
(Continued)

FOREIGN PATENT DOCUMENTS

CN   104704618 A   6/2015
EP   3240025 A2   11/2017
(Continued)

OTHER PUBLICATIONS

Miyahara et al. (JP 2008-311371), machine translation. (Year: 2008).*
(Continued)

*Primary Examiner* — John A Hevey
(74) *Attorney, Agent, or Firm* — Leason Ellis LLP

(57) ABSTRACT

A metal sintered bonding body bonds a substrate and a die. In the metal sintered bonding body, at least a center part and corner part of a rectangular region where the metal sintered bonding body faces the die have a low-porosity region whose porosity is lower than an average porosity of the rectangular region. The low-porosity region is located within a strip-shaped region whose central lines are diagonal lines of the rectangular region.

17 Claims, 5 Drawing Sheets

(52) U.S. Cl.
CPC ............... *H01L 2224/29218* (2013.01); *H01L 2224/29224* (2013.01); *H01L 2224/29239* (2013.01); *H01L 2224/29244* (2013.01); *H01L 2224/29247* (2013.01); *H01L 2224/29255* (2013.01); *H01L 2224/29264* (2013.01); *H01L 2224/29266* (2013.01); *H01L 2224/29269* (2013.01); *H01L 2224/8384* (2013.01); *H01L 2924/3512* (2013.01)

(58) Field of Classification Search
CPC . H01L 2224/29239; H01L 2224/29244; H01L 2224/29247; H01L 2224/29255; H01L 2224/29264; H01L 2224/29266; H01L 2224/29269; H01L 2224/8384; H01L 2924/3512; H01L 2224/83439; H01L 24/27; H01L 2224/83009; H01L 2224/83047; H01L 2224/83204; H01L 2224/27418; H01L 2224/27312; H01L 2224/2731; H01L 2224/2732; H01L 2224/29294; H01L 2224/29339; H01L 2224/29347; H01L 2224/29364; H01L 2224/29344; H01L 2224/29369; H01L 2224/29366; H01L 2224/29355; H01L 2224/29324; H01L 2224/29318; H01L 2224/3201; H01L 24/32; H01L 21/52; H01L 21/185; B22F 7/064; B22F 7/06; B22F 3/12

See application file for complete search history.

(56) References Cited

U.S. PATENT DOCUMENTS

| | | |
|---|---|---|
| 2015/0255419 A1 | 9/2015 | Nishimoto et al. |
| 2017/0045136 A1 | 2/2017 | Taga et al. |
| 2017/0190696 A1 | 7/2017 | Orimoto et al. |
| 2017/0294397 A1* | 10/2017 | Croteau .................. H01L 24/27 |

FOREIGN PATENT DOCUMENTS

| | | | |
|---|---|---|---|
| JP | 2008-311371 A | 12/2008 | |
| JP | 2008311371 A | * 12/2008 | ............ H01L 24/32 |
| JP | 5207281 B | 7/2009 | |
| JP | 2010-149185 A | 7/2010 | |
| JP | 2014-029897 A | 2/2014 | |
| JP | 2014-110282 A | 6/2014 | |
| JP | 2015-216160 A | 12/2015 | |
| TW | 2010-38699 A | 11/2010 | |
| WO | WO-2010/081752 A1 | 7/2010 | |
| WO | WO-2010/110069 A1 | 9/2010 | |
| WO | WO-2012/004876 A1 | 1/2012 | |
| WO | WO-2014/155619 A1 | 10/2014 | |
| WO | WO-2015/163248 A1 | 10/2015 | |
| WO | WO-2015/163478 A1 | 10/2015 | |

OTHER PUBLICATIONS

Daijiao Wang, Experimental study of void formation in solder joints of flip-chip assemblies, May 2005, 220 pages.
International Search Report and Written Opinion dated Nov. 14, 2017 for the corresponding PCT Patent Application No. PCT/JP2017/029532.
Office Action dated Oct. 30, 2018 for the corresponding Taiwanese Patent Application No. 106127945.
Office Action dated Feb. 23, 2019 for the corresponding Taiwanese Patent Application No. 106127945 (the copy of the document previously submitted on May 15, 2019).
Office Action dated Feb. 23, 2019 for the corresponding Taiwanese Patent Application No. 10820165650.
Office Action dated Jul. 15, 2019 for the corresponding Chinese Patent Application No. 201780051107.0.
Extended European Search Report dated Sep. 23, 2020 for the corresponding European Patent Application No. 17843474.2.
Chapter 2, chapter 4 and chapter 6 in Book Series: Fortschritt-Berichte VDI, Series 21, No. 376, 2006, ISBN: 978-3-18-337621-6, pp. 4-26, 58-76, 102-117, VDI Verlag GmbH, Dusseldorf, Germany.

* cited by examiner

METALLIC SINTERED BONDING BODY AND DIE BONDING METHOD

CROSS-REFERENCE TO RELATED PATENT APPLICATIONS

This application is a U.S. National Phase Application under 35 U.S.C. § 371 of International Patent Application No. PCT/JP2017/029532, filed Aug. 17, 2017, and claims the benefit of Japanese Patent Application No. 2016-162247, filed on Aug. 22, 2016, all of which are incorporated herein by reference in their entirety. The International Application was published in Japanese on Mar. 1, 2018 as International Publication No. WO/2018/037992 under PCT Article 21(2).

FIELD OF THE INVENTION

The present invention relates to a metal sintered bonding body used for die bonding and a die bonding method.

BACKGROUND OF THE INVENTION

In a power device used in a vehicle or the like, a semiconductor such as SiC or GaN having a band gap wider than that of Si is used. These exhibit excellent properties such as high power conversion efficiency and low loss due to the use at a high temperature. Therefore, a connection part of the power device is also required to have improved heat resistance.

In general, a bond between metals is performed by a solder. A solder alloy which has been used in the related art has low electrical conductivity, low thermal conductivity, and a low melting point and is difficult to withstand a driving temperature of the power device. Therefore, new die bonding materials are necessary for bonding of high-performance SiC/GaN represented as a power device.

In recent years, die bonding using an Ag paste having high electrical conductivity, high thermal conductivity, a high melting point and stability has been focused on. However, since the melting point of Ag is high, a substrate is thermally damaged when bonded in bulk. Therefore, in order to reduce a bonding temperature, a low-temperature sintering technique using nanoparticles has been adopted.

However, although a sintering temperature decreases when nanoparticles having a small particle diameter are used, sintered density decreases due to a porous metal sintered bonding body that bonds the die and the substrate, and as a result, heat cycle resistance and heat dissipation deteriorate. In order to obtain high heat cycle resistance and heat dissipation, it is necessary to improve the sintered density. In order to form a metal sintered bonding body having high sintered density, it is necessary to perform sintering while applying high pressure of 5 MPa to 10 MPa at a heating temperature of 250° C. or higher even when nanoparticles are used. Since an IC and the substrate deteriorate at such a high temperature and high pressure, studies have been made to achieve higher sintered density at lower temperature and lower pressure.

For example, Japanese Patent No. 5207281 discloses a conductive paste containing hybrid Ag particles in which Ag nanoparticles having an average particle size of 0.3 μm to 0.5 μm and Ag particles having an average particle size of 2.0 μm to 3.2 μm are mixed, and a lower alcohol, and containing no adhesive. In the invention described in Japanese Patent No. 5207281, it seems that the adhesive is not contained in order to reduce electrical resistance, but porosity can be reduced due to the use of the hybrid particles. Structures having low porosity are formed by utilizing easy occurrence of grain boundary diffusion between small particles and large particles.

On the other hand, studies in which pressurization is not performed during sintering not using hybrid particles but using nanoparticles have been performed. Japanese Unexamined Publication No. 2014-110282 discloses a technique in which a paste is applied to a substrate in a wider area than a member to be bonded, and the paste is pressurized at room temperature such that an amount of pressing the paste by the member to be bonded is 30% or more of the thickness of the applied paste, followed by sintering without pressurization, in order to prevent a notch which occurs between the member to be bonded and the paste during sintering.

Technical Problems

However, Japanese Patent No. 5207281 does not describe any pressure during sintering. There is a limit on the reduction of porosity because a hybrid Ag paste is merely used therein. In addition, since the invention described in Japanese Patent No. 5207281 aims not to contain an adhesive in the paste in order to reduce an electrical resistance value, it is difficult to say that studies for improving each properties of heat cycle resistance and heat dissipation are sufficient.

In the invention described in Patent Document 2, as described above, it seems that occurrence of a notch is prevented because sintering is performed without pressurization after the pressurization at room temperature. However, in Japanese Unexamined Publication No. 2014-110282, an amount of pressing the member to be bonded before sintering is only specified in a pressurization method for the pressurization. Although pressurization is performed at room temperature before sintering, porosity cannot be sufficiently reduced due to the sintering without pressurization thereafter, and the heat cycle resistance and heat dissipation cannot be sufficiently improved.

In addition, in the inventions described in both documents, if sintering is performed while pressurizing to such an extent that the IC and the substrate do not deteriorate, it is thought that the porosity is slightly reduced. However, because of miniaturization of the power device and rise in an operating temperature, it is difficult to meet the demand for high heat cycle resistance and heat dissipation only by slightly reducing the porosity.

Therefore, an object of the present invention is to provide a metal sintered bonding body having excellent heat cycle resistance and heat dissipation, and a die bonding method.

SUMMARY OF THE INVENTION

Solution to Problems

The present inventors performed extensive studies to achieve both heat cycle resistance and heat dissipation. With regard to the heat cycle resistance, attention was paid to the improvement of the heat cycle resistance in a corner part of a die since extension of a crack occurs from the corner part of the die as the number of cycles increases. In addition, with regard to the heat dissipation, attention was paid to the efficient dissipation of heat in the center part because the temperature is the highest in the center part since an IC is provided in the center part of the die in general.

In the related art, in order to bond the die and a substrate, for example, a metal sintered bonding body having a uniform structure as illustrated in drawings of Japanese Unexamined Publication No. 2014-110282 has been studied. However, in order to satisfy both the heat cycle properties and the heat dissipation, the present inventors assumed that the structure of the metal sintered bonding body should not be uniform unlike the related art, and conceived of making the metal sintered bonding body a non-uniform structure daringly, and performed further studies. The present inventors have realized that the heat cycle resistance and the heat dissipation can be simultaneously improved by reducing porosity of a region corresponding to the center part of the die, in the metal sintered bonding body, and a region corresponding to the corner part of the die, in the metal sintered bonding body.

Such a metal sintered bonding body cannot be obtained only by applying pressure before or during sintering as in the related art. For example, FIG. 5 and FIG. 6 of Japanese Unexamined Publication No. 2014-110282 show photographs in which a sintered body is observed by an ultrasonic microscope. If there is variation in porosity, it should appear in these photographs, but the variation in porosity cannot be observed. Therefore, desired distribution of porosity cannot be obtained by simply pressurizing the paste applied to the substrate.

As a result of further studies, the present inventors focused on the behavior of the paste when pressurizing the paste. Since a paste is usually composed of powders and solvent, it is considered that the powders and the solvent flow simultaneously by pressurization. However, depending on pressurization conditions, the solvent is separated from the particles and only the solvent is pushed out to the outside. Thus, the present inventors investigated in detail the conditions in which the powders and the solvent flow simultaneously.

As a result, when the paste is applied in a rectangular shape having substantially the same area and substantially the same shape as the die and the applied paste is pressurized, the paste is pushed out from the vicinity of four sides and the porosity around the four sides increases, and since the porosity is relatively low in the corner part and the center part, the porosity of a strip-shaped region whose central lines are diagonal lines of the rectangular region is low. In addition thereto, it has also been found that the porosity of the strip-shaped region whose central lines are the diagonal lines of the rectangular region is low. As a result of further studies on various conditions during pressurization based on these findings, the present inventors have found that a metal sintered bonding body having desired distribution of the porosity as described above is obtained under the conditions of the specific pressing amount and specific pressurization rate.

Further, as in the invention described in Japanese Unexamined Publication No. 2014-110282, it has been found that even if the paste is applied in a range wider than the die and then the die is pressed onto the paste, the above porosity could not be obtained.

As described above, a phenomenon showing the distribution of the porosity is found in a state where the paste has a certain degree of fluidity. Therefore, the phenomenon is not found when a process of volatilizing an organic solvent is performed before sintering, as often performed in the related art. Further, it has been found that, after applying the paste, even by separately applying the paste to a portion where the porosity should be lowered and forming a density gradient in the metal sintered bonding body, porosity of at least the center part and corner part of the rectangular region in the strip-shaped region whose central lines are diagonal lines of the rectangular region facing the die is low.

The present invention achieved based on these findings is as follows.

(1) A metal sintered bonding body which bonds a substrate and a die, wherein at least a center part and corner part of a rectangular region where the metal sintered bonding body faces the die have a low-porosity region whose porosity is lower than an average porosity of the rectangular region, and the low-porosity region is located within a strip-shaped region whose central lines are diagonal lines of the rectangular region.

(2) The metal sintered bonding body according to the above (1), wherein a width of the strip-shaped region is 3% to 30% of a length of one side of the die.

(3) The metal sintered bonding body according to the above (1) or (2), wherein the center part is mainly occupied by the low-porosity region.

(4) The sintered metal bonding body according to the above (1) or (2), wherein the corner part is mainly occupied by the low-porosity region.

(5) The metal sintered bonding body according to the above (1) or (2), wherein the low-porosity region is uniformly present within the strip-shaped region.

(6) The metal sintered bonding body according to any one of the above (1) to (5), wherein an area ratio of the low-porosity region to the rectangular region is 15% or more.

(7) The metal sintered bonding body according to any one of the above (1) to (6), wherein an area ratio of the low-porosity region to the strip-shaped region is 60% or more.

(8) The metal sintered bonding body according to any one of the above (1) to (7), wherein porosity of the low-porosity region is 70% or less of the average porosity of the rectangular region.

(9) A die bonding method for bonding a die to a substrate via the metal sintered bonding body according to any one of the above (1) to (8) on the substrate, comprising:

an application step of applying the paste in a rectangular shape such that an application area of the paste is ±0.4% of an area of the die, in a rectangular region which is an application surface of the substrate and faces the die;

a placement step of placing the die on the applied paste;

a pressurization step of pressurizing the applied paste with the die such that a pressurization rate is 1 μm/s or more and a pressing amount of pressing the die onto the paste is 10% to 60% of a thickness of the applied paste; and a sintering step of sintering the paste after the pressurization step at a pressure of 3 MPa or less and a heating temperature of 180° C. to 350° C.

(10) The die bonding method according to the above (9), comprising an overcoat step of overcoating a center part and corner part of the rectangular region with the paste after the application step and before the placement step.

BRIEF DESCRIPTION OF THE DRAWINGS

FIG. 1A illustrates a step of placing a die on an Ag paste with a die mounter, FIG. 1B illustrates a step of pressurizing the Ag paste with the die, and FIG. 1C illustrates a step of placing a weight on the die and sintering the Ag paste on a hot plate while applying bonding pressure to the die.

FIG. 2A is an X-ray planar photograph (35 times), FIG. 2B is an SAT planar photograph, FIG. 2C is an SEM photograph (30 times) of an X-Y cross section of FIG. 2A, FIG. 2D is an enlarged cross-sectional photograph (1200 times) of a bonding interface in a portion surrounded by a broken line on a left side in FIG. 2C, and FIG. 2E is an enlarged cross-sectional photograph (1200 times) of a bonding interface in a portion surrounded by a broken line on a right side in FIG. 2C.

FIG. 3A is an X-ray planar photograph of Example 1, FIG. 3B is an X-ray planar photograph of Example 5, FIG. 3C is an X-ray planar photograph of Example 6, FIG. 3D is an X-ray planar photograph of Example 7, FIG. 3E is an X-ray planar photograph of Example 8, FIG. 3F is an X-ray planar photograph of Example 9, FIG. 3G is an X-ray planar photograph of Comparative Example 1, FIG. 3H is an X-ray planar photograph of Comparative Example 2, and FIG. 3I is an X-ray planar photograph of Comparative Example 4.

FIG. 4A is an enlarged cross-sectional SEM photograph of Example 1, and FIG. 4B is an enlarged cross-sectional SEM photograph of Comparative Example 1.

FIG. 5A is a cross-sectional SEM photograph of Example 1, and FIG. 5B is a cross-sectional SEM photograph of Comparative Example 1.

DETAILED DESCRIPTION OF THE INVENTION

Figure 1A:
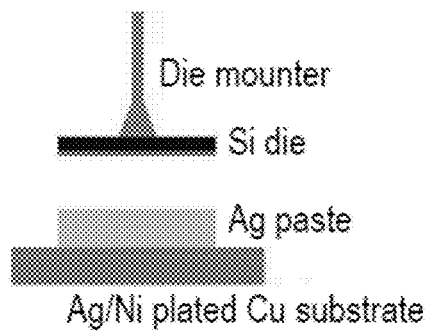
FIGS. 1A-1C are schematic process charts of a process of performing die bonding using a metal sintered bonding body in the present invention.

Description of embodiments is described in detail below as exemplification of the present invention.

1. Metal Sintered Bonding Body (1) Substrate and Die

A metal sintered bonding body in the present invention (hereinafter referred to as "bonding body" as appropriate) bonds a substrate and a die. In the present invention, the "die" is, for example, a commonly used material such as Si. The "die" is an electronic component. The "substrate" is not particularly limited as long as a later-described paste can be applied to a surface thereof. Examples of the "substrate" include a ceramic substrate containing aluminum oxide, aluminum nitride, zirconium oxide, zirconium nitride, titanium oxide, titanium nitride or a mixture thereof, a metal substrate containing Cu, Fe, Ni, Cr, Al, Ag, Au or Ti, a glass epoxy substrate, a BT resin substrate, a glass substrate, a resin substrate, and a paper.

Ag plating, Cu plating, Ni plating, or Au plating may be applied to these substrates to improve affinity with the paste. A thickness of the plating is preferably 50 nm to 50 μm.

(2) Rectangular Region where Metal Sintered Bonding Body Faces Die

As is described below, the metal sintered bonding body in the present invention has a feature in a rectangular region facing the die. This is because the die is usually rectangular in shape and the metal sintered bonding body needs to show heat cycle resistance and heat dissipation in a region facing the die. In the present invention, a corner part may be chamfered, or an angle may slightly deviate from 90°. In the present invention, the "rectangular" shape encompasses a rectangle and a square in a plane view.

(3) At Least a Center Part and Corner Part of the Rectangular Region have a Low-Porosity Region Whose Porosity is Lower than an Average Porosity of the Rectangular Region.

The metal sintered bonding body in the present invention has a low-porosity region where the porosity of at least the center part and corner part of the rectangular region facing the die is lower than the average porosity of the rectangular region from the viewpoint of improving heat cycle resistance and heat dissipation. In measurement of the heat cycle resistance, a crack extends to the bonding body mainly due to a stress applied to the corner part of the die. Therefore, by reducing the porosity of the region facing the corner part of the die, bonding strength of a portion where the crack most easily extends is improved, and the heat cycle resistance is improved.

In addition, with regard to the heat dissipation, most of wirings of power devices provided on the die concentrate on the center part of the die, so that the center part has the highest temperature during driving. Further, heat of the die is conducted radially in a surface direction of the substrate via the bonding body. Therefore, in the bonding body, the improvement of the heat dissipation of the center part of the bonding body corresponding to the center part of the die is an effective means for improving the heat dissipation.

Therefore, while the porosity of the bonding body is made uniform in the related art, in the metal sintered bonding body in the present invention, it is possible to realize both high heat cycle resistance and heat dissipation which could not be achieved in the related art, by daringly providing a low-porosity region in at least the center part and corner part of the rectangular region which faces the die.

In the present invention, the "center part" refers to a region where a distance from a center point is within 30% of a length of one side of the die, the center point being a point at which diagonal lines intersect in the rectangular region where the metal sintered bonding body faces the die. Similarly, the "corner part" refers to a region where a distance from a vertex of the rectangular region is within 30% of the length of one side of the die in the rectangular area where the metal sintered bonding body faces the die. Since the low-porosity region in the present invention may be located within a strip-shaped region which is described below, it is not necessary to provide the low-porosity region over the "center part" and "corner part", and at least a part of each of the "center part" and "corner part" may be a low-porosity region.

In the present invention, the porosity of the low-porosity region can be determined as follows. A cross-sectional photograph of the metal sintered bonding body is photographed at 1200 times by an SEM or an optical microscope, a metal portion and a pore portion are identified, 20 straight lines are drawn in total each 10 at equal intervals vertically and horizontally, and a ratio is obtained by dividing a sum of a length of a portion where the lines and the pores overlap each other by a length of the lines. The low-porosity region can be visually distinguished because of a thick color in each of the SEM and the optical microscope.

In the present invention, the average porosity of the rectangular region in the bonding body can be determined as follows. First, an X-ray planar photograph of the bonding body is photographed at 35 times or more, and the photograph is printed such that the length of one side of the bonding body is 200 mm. Lines are drawn in the printed image to form a square grid having one side of 2 mm. Further, the low-porosity region and the other regions (hereinafter may be referred to as a "high-porosity region" as appropriate) are separated by cutting along a grid square. When the low-porosity region and the high-porosity region are included in one square, the grid square is divided equally into two.

Based on the area obtained by this method, an area ratio of the low-porosity region, which is a ratio of an area of the low-porosity region to an area of the rectangular region, and an area ratio of the high-porosity region, which is a ratio of an area of the high-porosity region to an area of the rectangular region, are calculated. Thereafter, the average porosity of the rectangular region can be determined by multiplying the area ratio of the low-porosity region by the porosity of the low-porosity region, multiplying the area ratio of the high-porosity region by the porosity of the high-porosity region, and calculating a sum of them. The porosity of the high-porosity region can be determined in the high-porosity region with the same method as the porosity of the low-porosity region.

(4) Porosity of Low-Porosity Region: 20% or Less

In the present invention, the lower the porosity of the low-porosity region is, the more preferable it is since the heat cycle resistance and the heat dissipation are improved. As the upper limit of the porosity of the low-porosity region, the porosity is preferably 20% or less, more preferably 15% or less, and particularly preferably 12% or less. On the other hand, it is realistically difficult to set the porosity of the low-porosity region to 0%. As the lower limit of the porosity of the low-porosity region, the porosity is preferably 1% or more, and more preferably 3% or more.

From the same viewpoint, the porosity of the low-porosity region is preferably 70% or less, more preferably 60% or less, and particularly preferably 55% or less of the average porosity of the rectangular region in the metal sintered bonding body.

(5) The Low-Porosity Region is Located within a Strip-Shaped Region Whose Central Lines are the Diagonal Lines of the Rectangular Region.

The metal sintered bonding body cannot exert an effect of the present invention only by having a low-porosity region. The heat cycle resistance is not improved when the low-porosity region is biased to one side, and is not improved even when the low-porosity region is uniformly dispersed over the entire rectangular region. In order to improve the heat cycle resistance efficiently, the low-porosity region needs to be located in a symmetrical region of the metal sintered bonding body. Thanks to this, a pair of low-porosity regions is present in at least two symmetric corners, and thus, high heat cycle resistance can be exhibited. Therefore, in the present invention, the low-porosity region is required to be located within a strip-shaped region whose central lines are the diagonal lines of the bonding body.

In the present invention, since a region of the corner part becomes wide when a width of the strip-shaped region is too wide, the low-porosity region cannot be arranged at a symmetrical position when the area of the low-porosity region is narrow, and desired heat cycle resistance may not be obtained. In addition, since a region of the center part becomes wide when the width of the strip-shaped region is too wide, there is a case where the low-porosity region cannot be arranged in a position so as to improve the heat radiation. Further, when the strip-shaped region is too wide and the low-porosity region occupies the entire strip-shaped region, strength of the entire metal sintered bonding body becomes too high, stress cannot be relaxed, and the die may be damaged. Therefore, the width of the strip-shaped region is desirably 3% to 30% of the length of one side of the die.

When the die is rectangular, the "length of one side" represents a length of a short side.

In the present invention, the area ratio of the low-porosity region to the rectangular region is preferably 10% or more, more preferably 15% or more, and particularly preferably 20% or more from the viewpoint of improving the heat cycle resistance and the heat dissipation. From the same viewpoint, the area ratio of the low-porosity region to the strip-shaped region is preferably 60% or more, more preferably 70% or more, and particularly preferably 80% or more. The area ratio of the low-porosity region can be determined when the average porosity is calculated as described above.

Further, there is a case where it is desired to improve either the heat dissipation or the heat cycle resistance preferentially depending on performance of the power device. Therefore, when it is desired to improve the heat dissipation, it is desirable that the low-porosity region is located to mainly occupy the center part. On the other hand, when it is desired to improve the heat cycle resistance, it is desirable that the low-porosity region is located to mainly occupy the corner part. Here, in the present invention, "mainly" represents an area ratio of 60% or more of the entire low-porosity region. When it is not necessary to improve either of the properties preferentially, the low-porosity region may be present uniformly in the strip-shaped region.

(6) Metal Particles

The metal sintered bonding body of the present invention may be composed of metal nanoparticles and may be composed of hybrid particles of microparticles and nanoparticles, and any of hybrid particles of flaky microparticles and nanoparticles may be used. From the viewpoint of ensuring flowability of the paste, the particle diameter of the metal particles is desirably ⅙ or less of a thickness of the bonding body.

Further, an element of the metal particles is desirably an element whose melting point shows a temperature at which the element does not melt at least at a driving temperature of the power device, and examples thereof include Ag, Cu, Pd, Au, Pt, Ti, Ni, Al, and Zn. Among these, Ag and Cu are preferable from the viewpoint of versatility, a mixed powder of these is preferable, and Ag is particularly preferable.

(7) Thickness of Metal Sintered Bonding Body

The thickness of the metal sintered bonding body is preferably 20 μm to 200 μm in order to ensure the bonding strength and uniformity during application. Since there is sufficient possibility that the die and the substrate are inclined, the thickness of the bonding body in the present invention is defined as a thickness at the center of the bonding body.

2. Die Manufacturing Method

Figure 1B:
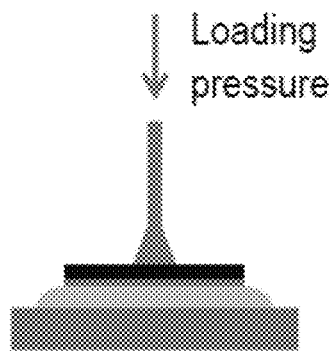
Figure 1C:
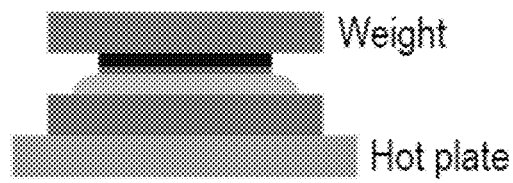

The metal sintered bonding body in the present invention can be manufactured, for example, as follows. An example of the manufacturing method is described using FIGS. 1A-1C. FIGS. 1A-1C are schematic process charts of a process of performing die bonding using a metal sintered bonding body of the present invention. FIG. 1A illustrates a step of placing a die on an Ag paste with a die mounter, FIG. 1B illustrates a step of pressurizing the Ag paste with the die, and FIG. 1C illustrates a step of placing a weight on the die and sintering the Ag paste on a hot plate while applying bonding pressure to the die.

(1) Step of Preparing Paste

First, metal microparticles, metal nanoparticles or hybrid particles of metal nanoparticles and metal microparticles are prepared. Then, a paste for forming the metal sintered bonding body of the present invention is manufactured. The paste is manufactured by stirring and mixing the metal particles or the hybrid particles and alcohol.

The alcohol is preferably a lower alcohol or a lower alcohol having one or more substituents selected from the group consisting of lower alkoxy, amino, and halogen. Examples of the lower alcohol include an alcohol including an alkyl group having one to six carbon atoms, and one to three hydroxyl groups, preferably one to two hydroxyl groups. Examples of the lower alkyl group include linear or branched alkyl groups such as a methyl group, an ethyl group, an n-propyl group, an i-propyl group, an n-butyl group, an i-butyl group, a sec-butyl group, a t-butyl group, an n-pentyl group, an i-pentyl group, a sec-pentyl group, a t-pentyl group, a 2-methylbutyl group, an n-hexyl group, a 1-methylpentyl group, a 2-methylpentyl group, a 3-methylpentyl group, a 4-methylpentyl group, a 1-ethylbutyl group, a 2-ethylbutyl group, a 1,1-dimethylbutyl group, a 2,2-dimethylbutyl group, a 3,3-dimethylbutyl group, and a 1-ethyl-1-methylpropyl group. Examples of the lower alcohol including an alkyl group having one to six carbon atoms and one to three hydroxyl groups include methanol, ethanol, ethylene glycol, n-propanol, propanol, triethylene glycol, n-butanol, i-butanol, sec-butanol, t-butanol, n-pentanol, pentanol, sec-pentanol, t-pentanol, 2-methylbutanol, n-hexanol, 1-methylpentanol, 2-methylpentanol, 3-methylpentanol, 4-methylpentanol, 1-ethylbutanol, 2-ethylbutanol, 1,1-dimethybutanol, 2,2-dimethylbutanol, 3,3-dimethylbutanol, and 1-ethyl-1-methylpropanol.

In the lower alcohol including one or more substituents selected from the group consisting of lower alkoxy, amino and halogen, substituents are as follows. Examples of the lower alkoxy include groups in which a part of the lower alkyl group is substituted with "—O—". Examples of the lower alkoxy include methoxy, ethoxy, n-propoxy, i-propoxy, n-butoxy, i-butoxy, sec-butoxy, t-butoxy, and n-pentyloxy. Examples of the halogen include fluorine, bromine, chlorine, and iodine.

Examples of the lower alcohol having one or more substituents selected from the group consisting of lower alkoxy, amino and halogen include methoxymethanol, 2-methoxyethanol, 2-ethoxyethanol, 2-chloroethanol, and ethanolamine.

In order to manufacture the metal sintered bonding body of the present invention, viscosity of the paste is preferably adjusted for allowing the particles to flow by pressurizing the paste with the die as described later. The viscosity of the paste may be in a range of 0.1 Pa·s to 300 Pa·s, and preferably in a range of 100 Pa·s to 200 Pa·s. In order to prevent an increase in viscosity at room temperature, a boiling point of the alcohol is desirably 200° C. or higher. The content of powder in the paste may be 75 mass % to 95 mass %.

(2) Step of Applying Paste onto Substrate

In a step of applying the paste onto the substrate, the paste is applied to the rectangular region which faces the die in an application surface of the substrate. An area of the paste to be applied is desirably approximately the same as an area of the die. When the application area of the paste is too larger than the area of the die, the paste crowded out from a surface corresponding to the die obstructs flow of the paste when the paste is pressurized, and a strip-shaped region cannot be formed. On the other hand, when the application area of the paste is too small, the paste does not spread over the die even if the paste is pressurized, and the metal sintered bonding body is not formed at the corner part of the die. Therefore, the application area of the paste is preferably ±0.4% or less of the area of the die, more preferably ±0.3% or less of the area of the die, still more preferably ±0.1% of the area of the die, and particularly preferably substantially the same as the area of the die.

An application means is not particularly limited as long as the metal paste can be applied to the substrate surface. For example, the application may be performed by a printing method, a coating method, or the like. Examples of the printing method include screen printing, offset printing, inkjet printing, flexographic printing, gravure printing, stamping, dispensing, squeegee printing, silk screen printing, spraying, brushing, and the like, and screen printing, stamping and dispensing are preferable.

In the die bonding method of the present invention, the center part and the corner part of the strip-shaped region in the applied paste may be overcoated with the paste. Accordingly, the paste has a desired density gradient. In this case, as is described below, it is not necessary to pressurize the paste intentionally with the die, but the paste may be pressurized as in the following step (3). Because the paste flows when pressurized, it is possible to avoid an abrupt density gradient, thereby preventing cracks or the like during sintering. The subsequent sintering step is as described below.

A thickness of the applied metal paste is, for example, 20 μm to 500 μm, preferably 50 μm to 400 μm, and more preferably 80 μm to 300 μm.

(3) Step of Placing Die on Applied Paste

As illustrated in FIG. 1A, the die is adsorbed by the die mounter and placed on the paste. In this step, prior to placing the die on the paste, equipment which controls a clearance of the die mounter may be used to improve flatness of the die and the substrate. Specifically, an inclination angle between the die and the substrate is preferably 1° or less, more preferably 0.8° or less, and particularly preferably 0.5° or less. When the paste is pressurized in a state where the die is inclined, a low-porosity region cannot be formed in the center part and the corner part of the rectangular region as in the metal sintered bonding body in the present invention. The following is presumed as the reason. When the die is inclined, the paste flows in one direction rather than isotropically, and no low-porosity region occurs, or even if a low-porosity region occurs, it occurs only on one side of the bonding body, and the low-porosity region cannot be located in a symmetrical region of the bonding body. On the other hand, when the die pressurizes the paste in a state where the substrate and the die are hardly inclined and flatness is extremely high, the pressure is uniformly applied to the paste, the paste flows isotropically, and the low-porosity region occurs at a predetermined position.

(4) Pressurization Step of Pressurizing Paste with Die

Next, as illustrated in FIG. 1B, the Ag paste is pressurized with the die.

In the present invention, the low-porosity region is formed by pressurizing the paste under the above conditions. This is presumed as follows. When the die is pressurized, the paste spreads to some extent, and the paste is crowded out from four side portions of the die. Then, powder density in a neighboring region of four sides decreases, and porosity increases in a neighboring region of four sides after sintering. On the other hand, in the corner part, even if the paste is pressed by the die, the paste is hardly crowded out, and thus, a decrease in the powder density is not seen. Then, the porosity of the strip-shaped region whose central lines are the diagonal lines does not increase, and the low-porosity region is formed in the strip-shaped region.

In the present invention, regardless of flowability of the paste, the paste needs to be pressed in a range of 10% to 60% of application thickness of the paste so that the metal sintered bonding body has a predetermined thickness. Within this range, the paste flows isotropically to obtain the desired density gradient. When the pressing amount is less than 10%, the paste does not flow sufficiently, and the desired density gradient cannot be obtained. As the lower limit of the pressing amount, it is 10% or more, preferably 20% or more, and more preferably 25% or more. On the other hand, when the pressing amount exceeds 60%, the amount of the paste crowded out is too large, and a desired thickness of the metal sintered bonding body cannot be obtained. Further, an amount of the paste remaining under the die decreases, density distribution decreases, and the desired low-porosity region cannot be obtained. As the upper limit of the pressing amount, it is 60% or less, preferably 50% or less, and more preferably 40% or less.

In the present invention, the die is pressed onto the paste at a pressurization rate of 1 μm/s or more such that the paste flows with powder and solvent. When the pressurization rate is less than 1 μm/s, only solvent components in the paste are pushed out to the outside, the powder does not flow, and the low-porosity region is not obtained. As the lower limit of the pressurization rate, it is 1 μm/s or more, and preferably 2 μm/s or more. The upper limit of the pressurization rate is not particularly limited, and the pressurization rate may depend on specification of an apparatus and may be the range where the control of the pressing amount is possible, and the pressurization rate is preferably 200 μm/s or less.

Pressurization time may be time within which a density gradient due to pressurization appears, and may be about several seconds to one minute.

Since pressurization is a step before sintering, pressurization is preferably performed at room temperature from the viewpoint of ensuring the flowability of the paste. When the flowability of the paste is desired to be raised, the paste can also be heated to an extent of not volatilizing, and may be heated to about 50° C., for example.

(5) Step of Sintering Paste in Temperature Range of 180° C. to 350° C. while Applying Bonding Pressure As illustrated in FIG. 1C, the Ag paste is sintered on a hot plate while applying bonding pressure in a state of placing a weight on the die. Mass of the weight placed on the die is appropriately selected such that the bonding pressure is 3 MPa or less. When the bonding pressure exceeds 3 MPa, an IC and the substrate may be damaged. Further, a thickness of the bonding body sintered under the die becomes thin, the density distribution decreases, and the desired low-porosity region cannot be obtained. Heating temperature is preferably in a temperature range from 180° C. to 350° C., and heating time is preferably from 5 to 300 minutes.

Since the density gradient generated in the paste does not disappear even if the die and the substrate are slightly inclined during sintering, the position at which the weight is placed is not particularly limited, but the center part of the die is desirable such that an inclination angle between the die and the substrate is maintained to fall within the above range. Instead of placing the weight on the die, bonding pressure may be applied using a spring, a cylinder, or the like.

After heating, air cooling is performed, and then, the die bonding ends.

EXAMPLES

Example 1

(Preparation of Paste)

In this Example, 50 g of Ag microflake particles having a thickness of 260 nm and an average particle diameter of 8.0 μm and 50 g of hybrid particles of sub microparticles having an average particle diameter of 0.3 μm were used to obtain Ag particles. The average particle diameter was determined by a laser method (a dynamic light scattering photometer DLS-8000 manufactured by Otsuka Electronics Co., Ltd.). The particles and ethylene glycol were mixed using a KEYENCEHM-500 hybrid mixer manufactured by Keyence Corporation to prepare a hybrid Ag paste having a viscosity of 150 Pa·s. In the paste, Ag particles accounted for 90 mass % of the paste.

(Paste Application, Die Placement, and Paste Pressurization on Die)

This paste was applied to have a size of 4 mm×4 mm×0.1 mm using a metal mask on a copper substrate of 20 mm×20 mm×1 mm having a surface on which Ni—Ag plating (thickness: 40 μm) was applied. Thereafter, a Si die of 4 mm×4 mm×0.4 mm was placed on the paste applied on a Cu substrate using a die mounter. Then, the paste was pressurized with the Si die at room temperature for 10 seconds at a load pressure of 0.2 MPa. The thickness of the paste after pressurization was 0.07 mm (70% of the thickness of the paste of at the time of application). The pressurization rate was shown in Table 1 below. At this time, the inclination angle between the substrate and the die was adjusted to 1° by using equipment which controls a clearance of the die mounter.

(Heating of Paste)

The weight was placed on the die and heating on a hot plate was performed at 180° C. for 5 minutes while applying a load pressure of 0.2 MPa, the temperature was raised to 250° C. at a temperature rise rate of 10° C./min, followed by holding for 30 minutes. After that, the temperature was cooled to room temperature, and then, the die bonding ended.

(Observation of Sintered Body)

A bonding state of the paste and the substrate or die was observed by a high speed scanning acoustic tomograph (SAT) using F300III manufactured by Hitachi, Ltd. In this image, a scanning pitch of an ultrasonic probe was set to 0.01 mm. In addition, X-ray observation was performed using TUX-3200 manufactured by Token Co., Ltd., and the presence or absence of density distribution was visually observed from the photographed X-ray photograph.

A cross-sectional microstructure of the bonding body was observed by an SEM using JSM-6610LV manufactured by JEOL, Ltd.

(State of Density, Porosity, and Area Ratio)

A state of density was visually observed from the X-ray planar photograph of the bonding body. The case where a thick color was confirmed in a strip-shaped region was evaluated as "0", and the case where a thick color was not confirmed was evaluated as "x".

Porosity of a low-porosity region was obtained as follows. A cross-sectional SEM photograph of the metal sintered bonding body was photographed at 1200 times, a metal portion and a pore portion were identified, 20 straight lines are drawn in total each 10 at equal intervals vertically and horizontally, and a ratio was obtained by dividing a sum of a length of a portion where each line and the pores overlap each other by a length of the each line.

For the average porosity of the entire bonding body, an X-ray planar photograph of the bonding body at 35 times was photographed and printed such that the length of one side of the bonding body is 200 mm Lines were drawn in the printed image to form a square grid having one side of 2 mm.

In the X-ray planar photograph, a portion having a thick color is the low-porosity region, and a portion having a thin color is a high-porosity region. Then, the low-porosity region and the high-porosity region were separated by cutting along a grid square. In a case where the low-porosity region and the high-porosity region are included in one square, a grid paper square was divided equally into two.

From the area obtained by this method, an area ratio of the low-porosity region, which is a ratio of an area of the low-porosity region to an area of the rectangular region, and an area ratio of the high-porosity region, which is a ratio of an area of the high-porosity region to an area of the rectangular region, were calculated. Thereafter, the average porosity of the rectangular region was determined by multiplying the area ratio of the low-porosity region by the porosity of the low-porosity region determined as described above, multiplying the area ratio of the high-porosity region by the porosity of the high-porosity region determined as described above, and calculating a sum of them. The low-porosity region was targeted to be located in the strip-shaped region whose central lines are diagonal lines of the metal sintered bonding body and in which the width is 20% of length of one side of the die.

(TCT Crack Extension Rate)

Heat cycle resistance was measured by observing a diagonal cross section of the die after a 500-cycle test under the conditions where −40° C. for 20 minutes and 200° C. for 40 minutes were used as one cycle, measuring a crack extension length on a diagonal line, and calculating an occupancy of the crack extension length as a crack extension rate when that of the entire diagonal line was 100%, and the occupancy was regarded as a crack extension rate.

Examples 2 and 5 to 10, and Comparative Examples 1 to 4

In these Examples, die bonding was performed by separately changing the conditions in Example 1 as described in Table 1.

Examples 3 and 4

In Example 1, after the paste was applied to the substrate, 0.5 mg of the same paste was re-applied to the center part (center) and the corner part (four corners), and then die bonding was performed in the same manner as in Example 1. In Example 3, the paste was separately applied to the corner part, and in Example 4, the paste was separately applied to the center part.

Comparative Example 5

Die bonding was performed in the same manner as in Example 1, except that the paste was applied in a size of 5 mm×5 mm×0.1 mm using a metal mask and the Si die of 4 mm×4 mm×0.4 mm was placed on a paste applied to a Cu substrate using the die mounter.

In Table 1, "-" indicates that no measurement was performed since the density gradient was not seen and the porosity was uniform.

TABLE 1

| | Component of powder | Mask opening (mm) | Die mounting rate (μm/s) | Die pressing depth (μm/s) | Pressurization start temperature | Pressure during heating (MPa) | Heating temperature (° C.) | State of density*1 | Thickness of metal sintered bonding body (μm) |
|---|---|---|---|---|---|---|---|---|---|
| Example 1 | Ag | 4 × 4 | 5.0 | 30 | 25 | 0.2 | 250 | ○ | 70 |
| Example 2 | Ag | 4 × 4 | 5.0 | 30 | 200 | 0.2 | 250 | ○ | 75 |
| Example 3 | Ag | 4 × 4 | 5.0 | 30 | 25 | 0.2 | 250 | ○ | 80 |
| Example 4 | Ag | 4 × 4 | 5.0 | 30 | 25 | 0.2 | 250 | ○ | 75 |
| Example 5 | Ag | 4 × 4 | 5.0 | 20 | 25 | 0.2 | 250 | ○ | 85 |
| Example 6 | Ag | 4 × 4 | 5.0 | 50 | 25 | 0.2 | 250 | ○ | 50 |
| Example 7 | Ag | 4 × 4 | 100.0 | 20 | 25 | 0.2 | 250 | ○ | 75 |
| Example 8 | Ag | 4 × 4 | 100.0 | 30 | 25 | 0.2 | 250 | ○ | 65 |
| Example 9 | Ag | 4 × 4 | 100.0 | 50 | 25 | 0.2 | 250 | ○ | 40 |
| Example 10 | Ag | 4 × 4 | 5.0 | 30 | 25 | 0 | 250 | ○ | 70 |
| Comparative Example 1 | Ag | 4 × 4 | 0.1 | 20 | 25 | 0.2 | 250 | x | 90 |
| Comparative Example 2 | Ag | 4 × 4 | 0.1 | 30 | 25 | 0.2 | 250 | x | 75 |
| Comparative Example 3 | Ag | 4 × 4 | 5 | 30 | 25 | 4 | 250 | x | 30 |
| Comparative Example 4 | Ag | 4 × 4 | 5 | 0 | 200 | 0.2 | 250 | x | 50 |
| Comparative Example 5 | Ag | 5 × 5 | 5 | 30 | 25 | 0.2 | 250 | x | 80 |

| | Area ratio of low-porosity region to metal sintered bonding body (%) | Width of strip-shaped region (μm) | Area ratio of low-porosity region to strip-shaped region (%) | Porosity of low-porosity region (%) | Average porosity of entire metal sintered bonding body (%) | Low porosity/Average porosity % | TCT crack Extension Rate (%) |
|---|---|---|---|---|---|---|---|
| Example 1 | 30 | 600 | 85 | 9.5 | 17.5 | 54.3 | 0% |
| Example 2 | 24 | 530 | 70 | 13.0 | 25.5 | 51.0 | 0% |
| Example 3 | 53 | 1000 | 70 | 7.5 | 18.0 | 41.7 | 0% |
| Example 4 | 47 | 820 | 65 | 8.5 | 17.0 | 50.0 | 5% |
| Example 5 | 35 | 740 | 95 | 11.5 | 23.0 | 50.0 | 0% |
| Example 6 | 18 | 500 | 90 | 10.0 | 16.0 | 62.5 | 2% |
| Example 7 | 28 | 720 | 95 | 8.0 | 20.0 | 40.0 | 4% |
| Example 8 | 24 | 580 | 85 | 7.5 | 16.5 | 45.5 | 2% |
| Example 9 | 22 | 450 | 75 | 6.5 | 15.5 | 38.7 | 3% |
| Example 10 | 26 | 570 | 90 | 10.0 | 18.5 | 54.1 | 3% |

TABLE 1-continued

| | | | | | | | |
|---|---|---|---|---|---|---|---|
| Comparative Example 1 | — | — | — | — | 31.0 | — | 32% |
| Comparative Example 2 | — | — | — | — | 29.5 | — | 25% |
| Comparative Example 3 | — | — | — | — | 8.5 | — | 20% |
| Comparative Example 4 | — | — | — | — | 33.0 | — | 40% |
| Comparative Example 5 | — | — | — | — | 28.0 | — | 17% |

As is apparent from Table 1, the bonding body of Examples had a predetermined density gradient, the low-porosity region was present in at least the center part and the corner part of the bonding body, and the porosity thereof showed a value lower than the average porosity. As a result, excellent heat cycle resistance was exhibited. Further, since such a low-porosity region is present, heat dissipation is also excellent. In Example 3, 60% or more of the entire low-porosity region was present at the corner part. In Example 4, 60% or more of the entire low-porosity region was present at the center part.

On the other hand, in Comparative Examples 1 and 2, since the die mounting rate density was slow and the paste did not flow isotropically, the density gradient was not observed at all, and the porosity was at the same level in any location of the bonding body, and the sintered density was uniform regardless of the location. Therefore, the porosity in Comparative Examples 1 and 2 showed the average porosity of the entire metal sintered bonding body regardless of the location.

In Comparative Example 3, since the pressure during heating was too high, the density gradient was not shown, and the low-porosity region was not formed.

In Comparative Example 4, since the paste was not pressed onto the die, the paste did not flow, the density gradient was not shown, and the low-porosity region was not formed.

In Comparative Example 5, an application area of the paste was wide and the paste was present around the die before pressurization, and thus, the paste located below the die was not crowded out from the die. Thus, the density gradient was not shown, and no low-porosity region was formed.

More detailed description is made using photographs below.

Figures 2A, 2B:
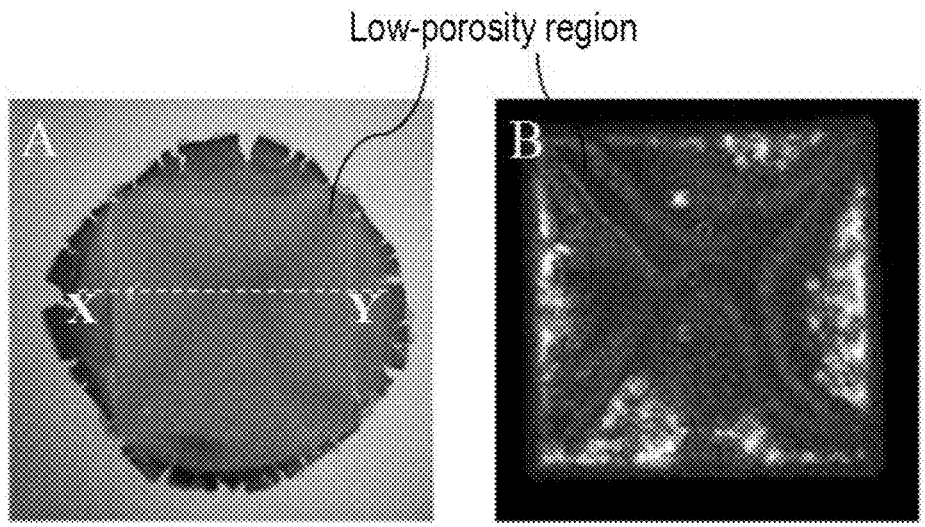
FIGS. 2A-2E are planar photographs and cross-sectional photographs of the metal sintered bonding body of Example 1.
Figure 2C:
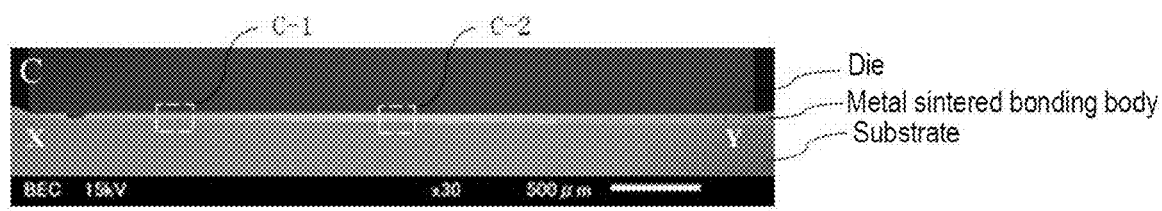
Figures 2D, 2E:
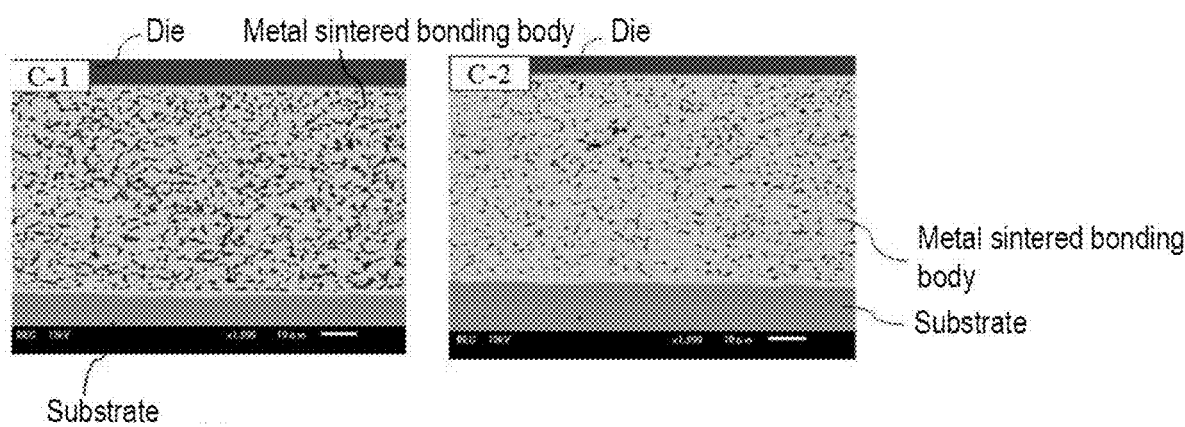

FIGS. 2A-2E are plane photographs and cross-sectional photographs of the bonding body of Example 1. FIG. 2A is an X-ray plane photograph (35 times), FIG. 2B is an SAT plane photograph, FIG. 2C is an SEM photograph (30 times) of an X-Y cross section of FIG. 2A, FIG. 2D is an enlarged cross-sectional photograph (1200 times) of a bonding interface in a portion surrounded by a broken line on a left side in FIG. 2C, and FIG. 2E is an enlarged cross-sectional photograph (1200 times) of a bonding interface in a portion surrounded by a broken line on a right side in FIG. 2C.

As is apparent from FIG. 2A and FIG. 2B, in Example 1, it was found that a low-porosity region was present in the strip-shaped region whose central lines are the diagonal lines. In Example 1, an area ratio of the low-porosity region to the metal sintered bonding body was 30%, and an area ratio of the low-porosity region to the strip-shaped region was 85%. As is apparent from FIG. 2C, it was found that no void was generated in the bonding interface. As is apparent from FIG. 2E, in an X-Y cross section in FIG. 2A, it was found that the low-porosity region illustrated in FIG. 2E had high sintered density because there were a few pores and low porosity was shown. Further, it was found that in the region illustrated in FIG. 2D, there were many pores and porosity was higher than that of the low-porosity region.

Figure 3A:
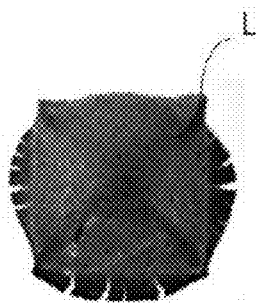
FIGS. 3A-3I are X-ray planar photographs of the metal sintered bonding body.
Figure 3B:
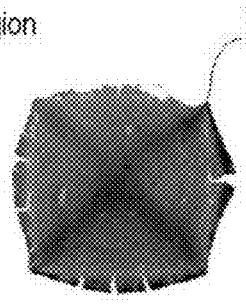
Figure 3C:
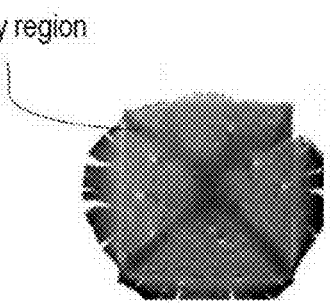
Figure 3D:
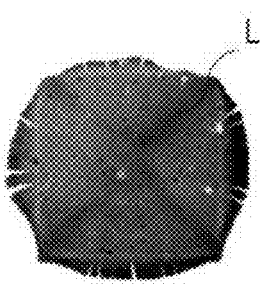
Figure 3E:
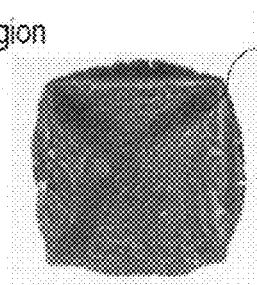
Figure 3F:
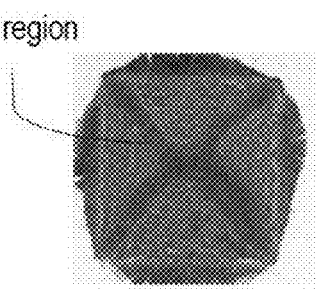
Figure 3G:
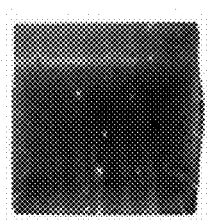
Figure 3H:
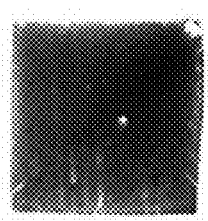
Figure 3I:
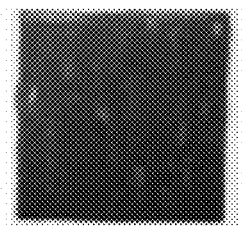

The result of investigating the die mounting rate and a die pressing amount are shown below. FIGS. 3A-3I are X-ray plane photographs of the metal sintered bonding body. FIG. 3A is an X-ray plane photograph of Example 1, FIG. 3B is an X-ray plane photograph of Example 5, FIG. 3C is an X-ray plane photograph of Example 6, FIG. 3D is an X-ray plane photograph of Example 7, FIG. 3E is an X-ray plane photograph of Example 8, FIG. 3F is an X-ray plane photograph of Example 9, FIG. 3G is an X-ray plane photograph of Comparative Example 1, FIG. 3H is an X-ray plane photograph of Comparative Example 2, and FIG. 3I is an X-ray plane photograph of Comparative Example 4.

As is apparent from FIG. 3A to FIG. 3F, in Examples, the strip-shaped region whose central lines are the diagonal lines has a thick color, and the region indicated by the thick color is the low-porosity region. On the other hand, as is apparent from FIG. 3G to FIG. 3I, in Comparative Example 1 and Comparative Example 2, since the die mounting rate was slow, the paste did not flow sufficiently and the low-porosity region was not seen. In Comparative Example 4, since the die was not pressed onto the paste, the paste did not flow and the low-porosity region was not seen.

Figures 4A, 4B:
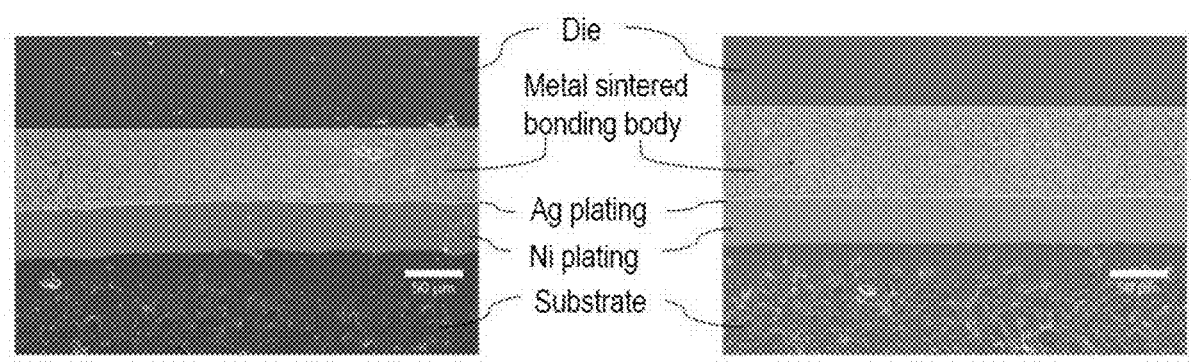
FIGS. 4A and 4B are enlarged cross-sectional views of the vicinity of a bonding interface of the metal sintered bonding body.

In FIGS. 3A-3I, in order to confirm that a thick-colored portion is the low-porosity region, distribution of pores was confirmed by cross section observation. FIGS. 4A and 4B is an enlarged cross-sectional view of the metal sintered bonding body in the vicinity of a bonding interface. FIG. 4A is an enlarged cross-sectional SEM photograph of Example 1, and FIG. 4B is an enlarged cross-sectional SEM photograph of Comparative Example 1. In FIGS. 4A and 4B, as in FIG. 2A, the metal sintered bonding body was cut into two pieces so as to pass through the center part, and the fractured cross sections were observed. As is apparent from FIG. 4A, pores were hardly seen in the center part of the metal sintered bonding body in Example 1, and many pores were seen in regions other than the center part. On the other hand, as is apparent from FIG. 4B, it was found that the pores were uniformly dispersed in the whole of the metal sintered bonding body in Comparative Example 1.

Figure 5A:
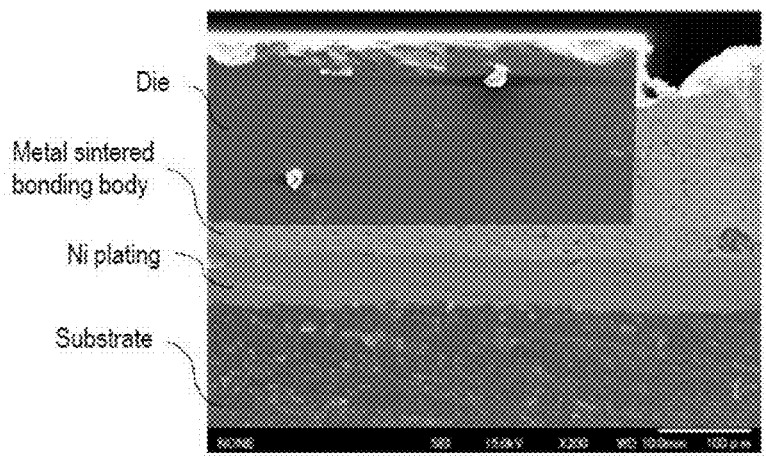
FIGS. 5A and 5B are cross-sectional SEM photographs of a bonding interface after a heat cycle test.
Figure 5B:
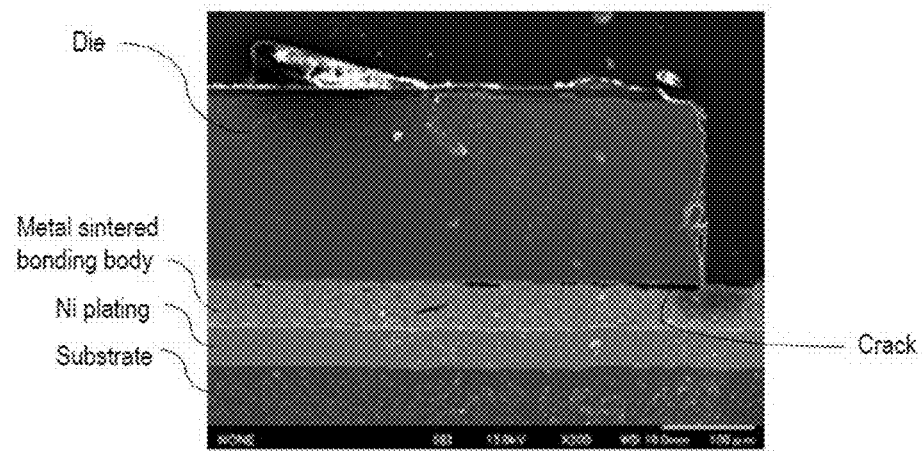

FIGS. 5A and 5B are cross-sectional SEM photographs of a bonding interface after a heat cycle test. FIG. 5A is a cross-sectional SEM photograph of Example 1, and FIG. 5B is a cross-sectional SEM photograph of Comparative Example 1. As illustrated in FIG. 5A, no crack was observed even after a heat cycle test in Example 1. On the other hand, as illustrated in FIG. 5B, it was found that cracks were generated after the heat cycle test in Comparative Example 1. Therefore, it was found that the crack extension ratio in Comparative Example 1 was larger.

The invention claimed is:

1. A metal sintered bonding body which bonds a substrate and a die, the metal sintered bonding body comprising:
   a rectangular region where the metal sintered bonding body faces the die, a surface area of the rectangular region differing from a surface area of the die by 0.4% or less, wherein
   the rectangular region comprises low-porosity regions whose porosity is lower than an average porosity of the rectangular region,
   the low-porosity regions are provided in strip-shaped regions whose central lines are diagonal lines of the rectangular region,
   a width of each of the strip-shaped regions is 3% to 30% of a length of one side of the die,
   60% or more of an entire area of the low-porosity regions occupies either a center part of the rectangular region or a corner part of the rectangular region, said corner part comprising four corners of the rectangular region,
   the center part is located from a center point of the rectangular region within 30% of a length of one side of the die, and
   the corner part is located from each of vertexes of the rectangular region within 30% of the length of one side of the die.

2. The metal sintered bonding body according to claim 1, wherein 60% or more of the entire area of the low-porosity regions occupies the center part.

3. The sintered metal bonding body according to claim 1, wherein 60% or more of the entire area of the low-porosity regions occupies the corner part.

4. The metal sintered bonding body according to claim 1, wherein an area ratio of the low-porosity regions to the rectangular region is 15% or more.

5. The metal sintered bonding body according to claim 1, wherein an area ratio of the low-porosity regions to the strip-shaped regions is 60% or more.

6. The metal sintered bonding body according to claim 1, wherein an average porosity of the low-porosity regions is 70% or less of the average porosity of the rectangular region.

7. A die bonding method for bonding a die to a substrate via the metal sintered bonding body according to claim 1 obtained by applying a paste onto the substrate and sintering the paste, comprising:
   an application step of applying the paste in a rectangular shape such that an application area of the paste is ±0.4% of an area of the die, in a rectangular region which is an application surface of the substrate and faces the die;
   a placement step of placing the die on the applied paste;
   a pressurization step of pressurizing the applied paste with the die such that a pressurization rate is 1 μm/s or more and a pressing amount of pressing the die onto the paste is 10% to 60% of a thickness of the applied paste; and
   a sintering step of sintering the paste after the pressurization step at a pressure of 3 MPa or less and a heating temperature of 180° C. to 350° C.

8. The die bonding method according to claim 7, comprising an overcoat step of overcoating a center part and corner part of the rectangular region with the paste after the application step and before the placement step.

9. The metal sintered bonding body according to claim 2, wherein an area ratio of the low-porosity regions to the rectangular region is 15% or more.

10. The metal sintered bonding body according to claim 2, wherein an area ratio of the low-porosity regions to the strip-shaped regions is 60% or more.

11. The metal sintered bonding body according to claim 2, wherein an average porosity of the low-porosity regions is 70% or less of the average porosity of the rectangular region.

12. The metal sintered bonding body according to claim 3, wherein an area ratio of the low-porosity regions to the rectangular region is 15% or more.

13. The metal sintered bonding body according to claim 1, wherein the strip-shaped regions are observed as an X-shaped thick color band from an X-ray planar photograph of the metal sintered bonding body.

14. A metal sintered bonding body which bonds a substrate and a die, the metal sintered bonding body comprising:
   a rectangular region where the metal sintered bonding body faces the die, a surface area of the rectangular region differing from a surface area of the die by 0.4% or less, wherein
   the rectangular region comprises low-porosity regions whose porosity is lower than an average porosity of the rectangular region,
   the low-porosity regions are provided in a center part and a corner part of the rectangular region, said corner part comprising four corners of the rectangular region,
   the center part is located from a center point of the rectangular region within 30% of a length of one side of the die, and
   60% or more of an entire area of the low-porosity regions occupies the center part.

15. A metal sintered bonding body which bonds a substrate and a die, the metal sintered bonding body comprising:
   a rectangular region where the metal sintered bonding body faces the die, a surface area of the rectangular region differing from a surface area of the die by 0.4% or less, wherein
   the rectangular region comprises low-porosity regions whose porosity is lower than an average porosity of the rectangular region,
   the low-porosity regions are provided in a center part and a corner part of the rectangular region, said corner part comprising four corners of the rectangular region,
   the corner part is located from each of vertexes of the rectangular region within 30% of the length of one side of the die, and
   60% or more of an entire area of the low-porosity regions occupies the corner part.

16. A metal sintered bonding body which bonds a substrate and a die, the metal sintered bonding body comprising:
   a rectangular region where the metal sintered bonding body faces the die, a surface area of the rectangular region differing from a surface area of the die by 0.4% or less, wherein
   the rectangular region comprises low-porosity regions whose porosity is lower than an average porosity of the rectangular region,
   the low-porosity regions are provided in strip-shaped regions whose central lines are diagonal lines of the rectangular region,
   a width of each of the strip-shaped regions is 3% to 30% of a length of one side of the die,
   the low-porosity regions are uniformly present throughout an entire area of the strip-shaped regions, and
   an average porosity of the strip-shaped regions is lower than an average porosity of other part of the rectangular region.

17. A metal sintered bonding body according to claim 16 wherein the low-porosity regions form an X-shape.

* * * * *